(12) United States Patent
Hughes et al.

(10) Patent No.: US 8,587,952 B1
(45) Date of Patent: *Nov. 19, 2013

(54) SYSTEM FOR INCREASING ISOLATION BOUNDARY WITHSTAND VOLTAGE

(75) Inventors: Brent Scott Hughes, Cumming, GA (US); Jason Pierce, Dahlonega, HI (US)

(73) Assignee: ARRIS Enterprises, Inc., Suwanee, GA (US)

( * ) Notice: Subject to any disclaimer, the term of this patent is extended or adjusted under 35 U.S.C. 154(b) by 113 days.

This patent is subject to a terminal disclaimer.

(21) Appl. No.: 13/237,290

(22) Filed: Sep. 20, 2011

Related U.S. Application Data

(63) Continuation of application No. 12/033,732, filed on Feb. 19, 2008, now Pat. No. 8,023,274.

(60) Provisional application No. 60/890,598, filed on Feb. 19, 2007.

(51) Int. Cl.
*H05K 5/00* (2006.01)

(52) U.S. Cl.
USPC ............... 361/753; 361/2; 361/15; 361/799

(58) Field of Classification Search
USPC ............ 361/1, 2, 15, 753, 799, 818; 174/350
See application file for complete search history.

(56) References Cited

U.S. PATENT DOCUMENTS

| | | | |
|---|---|---|---|
| 3,588,620 A | 6/1971 | Wasileski | |
| 5,272,592 A | 12/1993 | Harris et al. | |
| 5,836,441 A * | 11/1998 | Scheel et al. | 200/17 R |
| 7,372,692 B2 * | 5/2008 | Ranta et al. | 361/641 |
| 7,397,673 B1 * | 7/2008 | Wilson et al. | 361/775 |
| 7,768,794 B1 * | 8/2010 | Wilson et al. | 361/775 |
| 8,134,828 B2 * | 3/2012 | Creighton et al. | 361/644 |
| 2003/0048586 A1 | 3/2003 | Faber et al. | |
| 2006/0012969 A1 * | 1/2006 | Bachman | 361/816 |
| 2008/0117555 A1 | 5/2008 | Wilson et al. | |

* cited by examiner

*Primary Examiner* — Hoa C Nguyen
(74) *Attorney, Agent, or Firm* — Troy A. Van Aacken

(57) ABSTRACT

Insulating ribs are formed into one or more portions of a housing that encloses circuitry of an electrical device. Components mounted on a board are separated according to whether they are related to a primary side of a power transformer or a secondary side. Primary related components are typically mounted on the primary side of an isolation slot formed into a circuit board and components related to the secondary are mounted on the other side. The insulating ribs are strategically placed to protrude through the slots when circuit board is mounted to the housing portion. Thus, when the housing portion is joined to another housing portion, which also may include insulating ribs strategically placed, the ribs increase the breakdown voltage of the boundary.

15 Claims, 2 Drawing Sheets

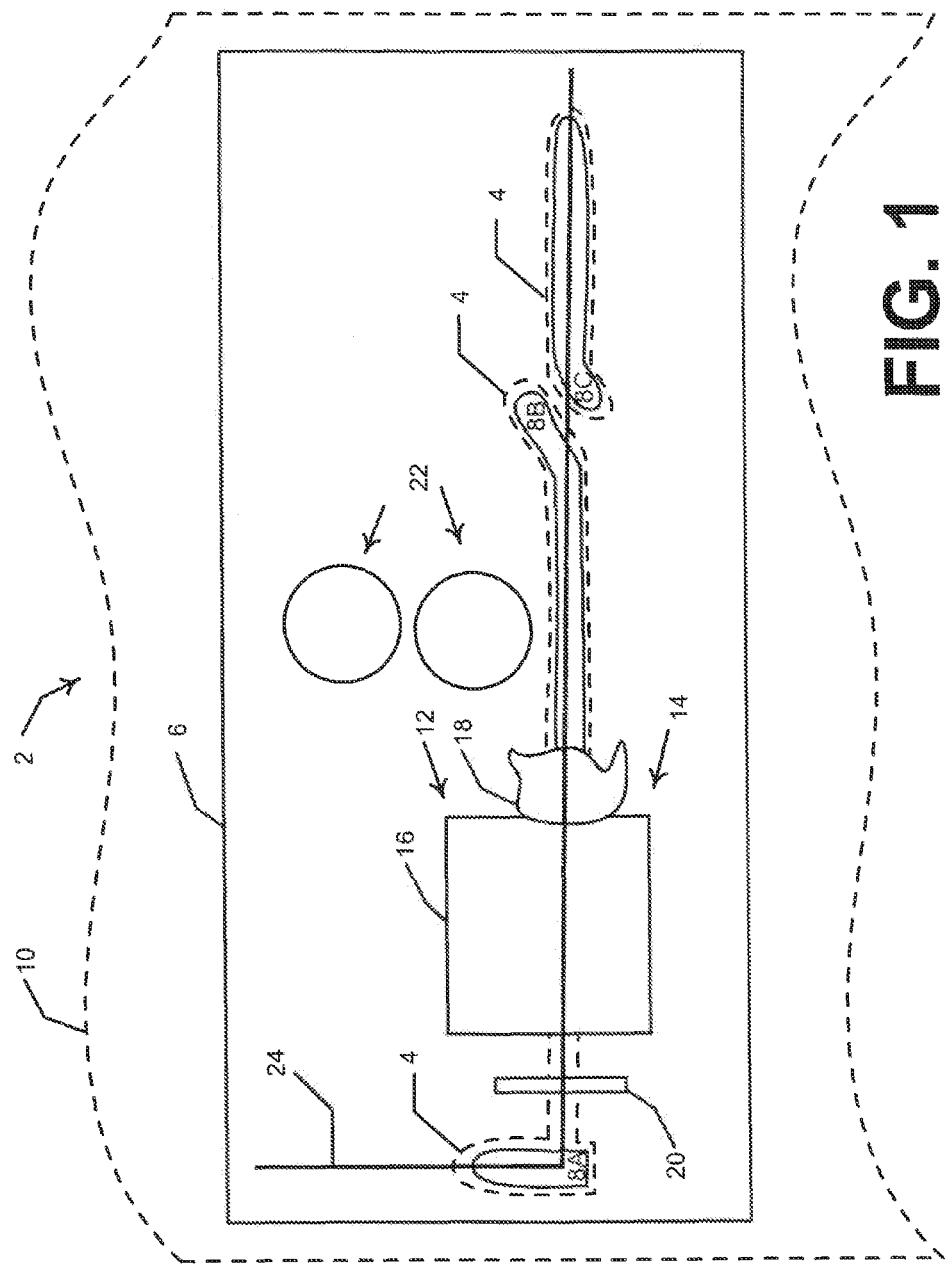

SYSTEM FOR INCREASING ISOLATION BOUNDARY WITHSTAND VOLTAGE

CROSS REFERENCE TO RELATED APPLICATION

This application claims priority under 35 U.S.C. 120 as a continuation of co-pending U.S. patent application Ser. No. 12/033,732, entitled "System for Increasing Isolation Boundary withstand Voltage," filed Feb. 19, 2008, which is a non-provisional patent application of Ser. No. 60/890,598, entitled "Method and Apparatus for Increasing Isolation Boundary withstand Voltage," filed Feb. 19, 2007, both of which are incorporated herein by reference in their entirety.

FIELD OF THE INVENTION

This invention relates, generally, to electronic communication network devices, and, more particularly to providing an enhanced boundary between primary and secondary power circuits therein.

BACKGROUND

AC/DC converters typically require isolation between primary and secondary circuits. Only very specific components are allowed to bridge this boundary. Examples of such components are optocouplers, transformers, and high voltage Y-capacitors. AC port surge requirements place a large surge voltage across this boundary. One way to improve surge immunity is to place a physical slot in the circuit board at the boundary between leads or traces that are at greatest risk for arcing. Typically these slots are added between the leads of components bridging the isolation boundary.

The PC boards define slots between primary and secondary components to reduce, or prevent, arcing. As soon as an arc occurs the air ionizes and approaches a short circuit. For a typical 10 kV, 2 Ohm test, current on the order of 5000 Amps can flow during arcing. Arcing typically occurs between any primary side component, or trace, and any secondary side component, or trace. The closer the points, the more likely they are to arc. Geometry also has an impact. Arcing occurs more likely between two sharp points than two smooth points with the same spacing between them. In the field, arcing can occur as a result of a common mode AC power surge, or lightning.

A slot between primary and secondary helps because without the slot, contaminants, such as, for example, specs of solder, dust, moisture, etc., may accumulate between primary and secondary components. Since these materials change the dielectric characteristics between primary and secondary components with respect to air, the contaminants effectively reduce the gap between the components, thus facilitating arcing there between.

When hi-potential testing a board having a slot between the primary and secondary components, an arc will typically run along the surface of the board around the slot if the arc endpoints are near the edge of the slot. Extending the slot to increase the distance around it is one solution to force an arc to have to travel farther between endpoints, thus reducing the likelihood of arcing occurring. However, this may not be an option with PC boards where space is limited.

While the air-gap formed by the slots in the circuit board provides an increased breakdown voltage, electric equipment manufacturers and users are always looking for improved performance, reduced cost, ease of manufacturing and reliability of the devices. Thus, there is a need in the art for improved withstand voltage boundary performance, for example increased arc resistance, in electric devices. Further, there is a need for improving withstand voltage boundary performance without increasing manufacturing costs or complexity of the electric device.

BRIEF DESCRIPTION OF DRAWINGS

FIG. 1 illustrates a system for increasing the break down voltage of the isolation boundary in an electric circuit.

DETAILED DESCRIPTION

Figure 2A:
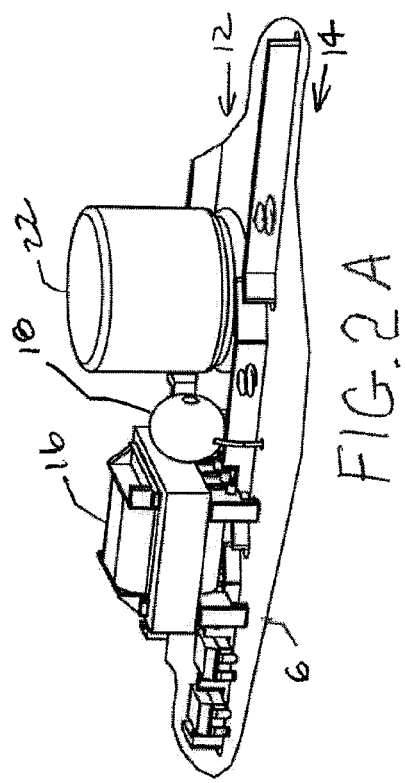
FIG. 2A illustrates a close-up view of an insulating rib protruding through a PC board.

As a preliminary matter, it readily will be understood by those persons skilled in the art that the present invention is susceptible of broad utility and application. Many methods, embodiments and adaptations of the present invention other than those herein described, as well as many variations, modifications, and equivalent arrangements, will be apparent from or reasonably suggested by the present invention and the following description thereof, without departing from the substance or scope of the present invention.

Accordingly, while the present invention has been described herein in detail in relation to preferred embodiments, it is to be understood that this disclosure is only illustrative and exemplary of the present invention and is made merely for the purposes of providing a full and enabling disclosure of the invention. The disclosure is not intended nor is to be construed to limit the present invention or otherwise to exclude any such other embodiments, adaptations, variations, modifications and equivalent arrangements, the present invention being limited only by the claims appended hereto and the equivalents thereof.

Turning now to FIG. 1, the figure illustrates a system 2 for enhancing the boundary withstand voltage capability provided by a slot, or slots, 4 cut into a circuit board 6. Insulating rib, or ribs, 8 added to enclosure housing 10, enhance(s) the withstand voltage capability provided by slot 4 alone. Rib 8, which is formed from a material having better insulating properties than air, protrudes through slot 4 thus increasing the withstand voltage capability that is provided by the slot itself. The dielectric strength of a typically plastic case used in electrical and electronic device housings is about 8 times greater than air. This means that it takes only about 1 mm of plastic to provide the same isolation as 8 mm of air. Accordingly, bold line 24 represents, or indicates, the isolation boundary that has the higher withstand voltage capacity. Even though rib(s) 8 may not be continuous along the entire slotted areas 4, by placing the ribs strategically within the slots, the enhanced withstand voltage boundary is substantially continuous along boundary line 24.

Figure 2:
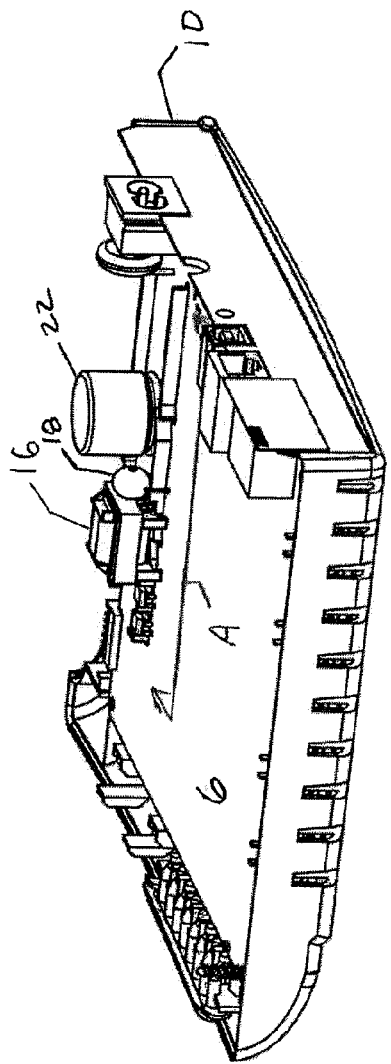
FIG. 2 illustrates an insulating rib protruding through a PC board mounted in a housing portion.

Turning now to FIG. 2, a PC board 6 is mounted in a portion of a device housing 10, such as, for example, substantially one half of a cable modem, or EMTA, housing. A power transformer 16, power capacitor 22 and small capacitor 18 span a boundary between the primary components on board 6 and the secondary components on the PC board. Section cut lines A refer to FIG. 2A.

Turning now to FIG. 2A, a close up view of components spanning a primary-secondary boundary is shown. Transformer 16 and capacitor 18 span the boundary. Capacitor 22 is on the primary side of the boundary in PC board 6. The ability of the boundary to reduce arcing between components on primary side 12 and secondary side 14 is enhanced by ribs 8, which protrude through a slot in board 6. In the embodiment illustrated in the figures, ribs 8 are molded as part of housing portion 10, which is shown in FIG. 2. It will be appreciated that the rib may comprise multiple ribs that protrude through separate slots that PC board 6 defines substantially along the withstand boundary. Separate slots may be defined for various reasons, including mechanical strength of PC board 6. In the figure, ribs 8 protrude through board 6, but are separated underneath capacitor 18 and transformer 16, and next to capacitor 22. However, the embodiment illustrated in FIG. 2 and FIG. 2A shows that at slot discontinuities, an end of each rib 8 is angled parallel to the end of the next rib so that the tip of one angled end overlaps/extends past the tip of another with respect to the withstand voltage boundary. These ends of the ribs next to one another may be referred to as overlapping ends.

What is claimed is:

1. A system for providing enhanced boundary voltage withstand capabilities in an electric device, comprising:
    a portion of a housing for enclosing electric components;
    a circuit board operable to facilitate mounting electric components within the housing, the circuit board defining one or more withstand boundary voltage slots; and
    insulating ribs coupled to the portion of the housing, the insulating ribs protruding through the withstand boundary voltage slots when the circuit board is mounted to the housing, wherein the insulating ribs define at least one discontinuity and the proximate ends of the insulating ribs are angled away from each other.

2. The system of claim 1 wherein the ribs are formed as part of the portion of the housing.

3. The system of claim 2 wherein the ribs and portion of the housing are molded as a single piece.

4. A system operable to provide enhanced boundary voltage withstand characteristics for an electrical device, comprising:
    at least a portion of a housing operable to provide an enclosure for electrical components;
    a circuit board operable to mount electrical components within the housing, the circuit board defining at least a first area and a second area; and
    a first insulating rib and a second insulating rib extending through the circuit board and defining a withstand voltage between the first area and the second area, wherein the first insulating rib and second insulating rib include a discontinuity between the first insulating rib and second insulating rib, and proximate portions of the first insulating rib and second insulating rib include end portions which are angled away from each other.

5. The system of claim 4, wherein the end portions are arranged to be substantially parallel to each other.

6. The system of claim 4, wherein the ribs are formed as part of the portion of the housing.

7. The system of claim 6, wherein the ribs and portion of the housing are molded as a single piece.

8. A system for providing enhanced boundary voltage in an electronic device, comprising:
    a circuit board operable to mount electronic components within a housing, the circuit board including a first area and a second area, wherein the first area and second area are separated by a first slot and a second slot operable to allow insulating ribs to protrude through the circuit board, the first and second slots including a discontinuity between the first and second slots and being operable to separate the first area and second area, wherein proximate portions of the first and second slots include end portions which are angled away from each other.

9. The system of claim 8, wherein the ends portions are arranged substantially parallel to each other.

10. The system of claim 8, wherein the ribs are formed as part of the portion of the housing.

11. The system of claim 10, wherein the ribs and portion of the housing are molded as a single piece.

12. A process for manufacturing an electronic device having enhanced boundary voltage withstand capabilities, comprising:
    manufacturing a circuit board operable to be used to mount electronic components within a housing such that the circuit board defines a first withstand boundary voltage slots and a second withstand boundary voltage slot; and
    coupling insulating ribs to the circuit board through the first and second withstand boundary voltage slots, wherein the first withstand boundary voltage slot and second withstand boundary voltage slot are non-continuous and proximate end portions of the boundary voltage slots are angled away from each other.

13. The process of claim 12, wherein the ribs are manufactured as part of the portion of the housing.

14. The process of claim 13, wherein the ribs and portion of the housing are molded as a single piece.

15. The process of claim 12, wherein the proximate end portions of the withstand boundary voltage slots are substantially parallel to each other.

* * * * *